(12) United States Patent
Kobayashi et al.

(10) Patent No.: US 8,257,605 B2
(45) Date of Patent: Sep. 4, 2012

(54) APPARATUS AND METHOD FOR REMOVING COATING FILM

(75) Inventors: Shinji Kobayashi, Kikuchi-gun (JP); Norihisa Koga, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 323 days.

(21) Appl. No.: 12/620,375

(22) Filed: Nov. 17, 2009

(65) Prior Publication Data

US 2010/0059087 A1    Mar. 11, 2010

Related U.S. Application Data

(62) Division of application No. 10/920,407, filed on Aug. 18, 2004, now Pat. No. 7,641,763.

(30) Foreign Application Priority Data

Sep. 29, 2003   (JP) .................................. 2003-337604

(51) Int. Cl.
*C03C 15/00*   (2006.01)

(52) U.S. Cl. ............. 216/91; 216/83; 438/748; 438/745

(58) Field of Classification Search ......................... None
See application file for complete search history.

(56) References Cited

U.S. PATENT DOCUMENTS

| | | | |
|---|---|---|---|
| 4,439,244 A | 3/1984 | Allevato | |
| 5,608,943 A | 3/1997 | Konishi et al. | |
| 5,688,411 A * | 11/1997 | Kutsuzawa et al. | ............. 216/92 |
| 5,993,547 A | 11/1999 | Sato | |
| 6,079,428 A * | 6/2000 | Anai | .............................. 134/172 |
| 6,238,511 B1 * | 5/2001 | Sada et al. | ..................... 156/704 |
| 6,863,796 B2 | 3/2005 | Chueh et al. | |
| 6,983,755 B2 | 1/2006 | Nam et al. | |

FOREIGN PATENT DOCUMENTS

| | | |
|---|---|---|
| DE | 41 02 357 A1 | 7/1992 |
| DE | 42 02 194 C2 | 7/1993 |
| JP | 11-76908 | 3/1999 |
| JP | 11-160891 | 6/1999 |

OTHER PUBLICATIONS

English Translation of JP Publication No. 11-160891 Sada, et al.

* cited by examiner

*Primary Examiner* — Lan Vinh
*Assistant Examiner* — Jiong-Ping Lu
(74) *Attorney, Agent, or Firm* — Oblon, Spivak, McClelland, Maier & Neustadt, L.L.P.

(57) ABSTRACT

An apparatus and a method for removing a coating film capable of stable treatment for removing unnecessary coating film at a substrate edge are provided. A substrate is clamped by approach stages from front and rear directions on a chuck, and fixed when accurate registration thereof is achieved. Then, the substrate edge is moved back and forth together with the chuck and the approach stage, so that the edge of the substrate is introduced in a space between an upper piece and a lower piece of a fixed arm portion. While the substrate is being moved, a solvent is fed from a nozzle portion onto a surface thereof and a purge gas is fed through a purge gas feeding pipe, so as to remove the coating film from the surface of the substrate by sucking and discharging the solvent and dissolved coating film through a discharge pipe.

5 Claims, 17 Drawing Sheets

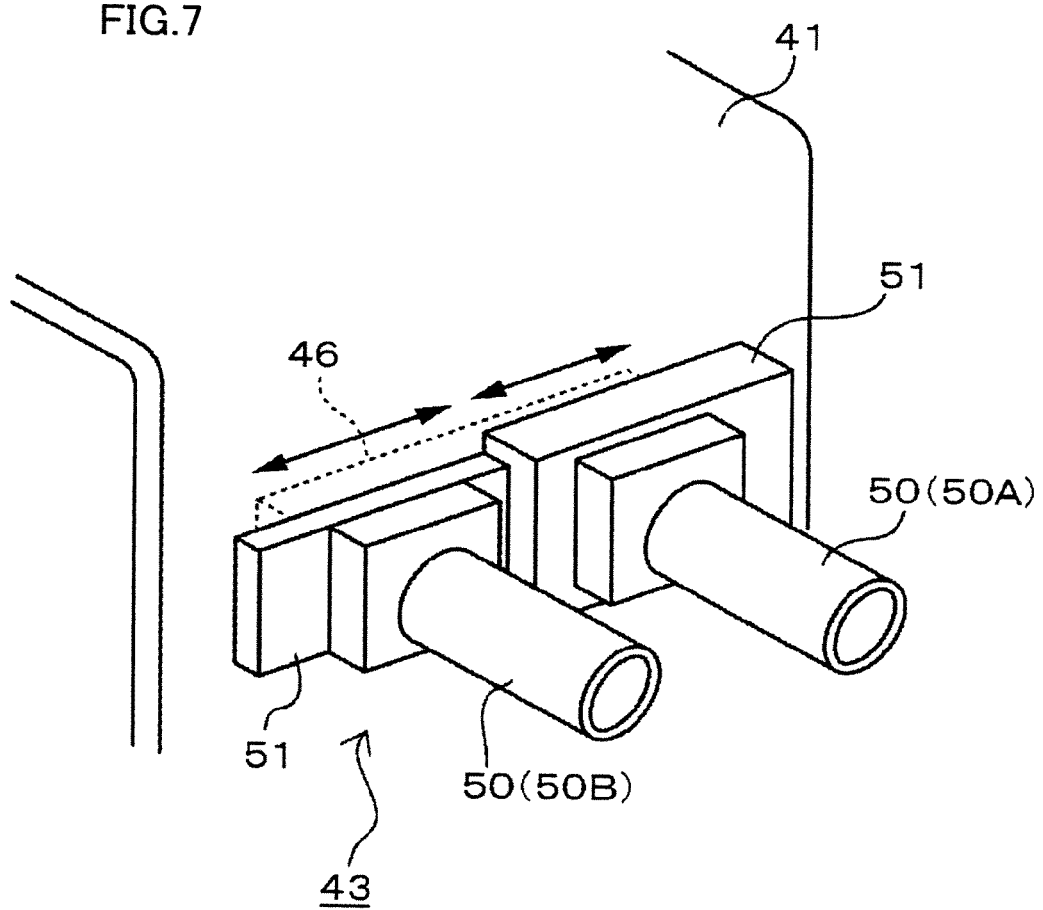

APPARATUS AND METHOD FOR REMOVING COATING FILM

CROSS REFERENCE TO RELATED APPLICATIONS

This application is a divisional of, and claims the benefit of priority under 35 U.S.C. §120 from, U.S. Ser. No. 10/920,407, filed Aug. 18, 2004, the entire contents of which are incorporated herein by reference. U.S. Ser. No. 10/920,407 is, in turn, based upon, and claims the benefit of priority under 35 U.S.C. §119 from, Japanese Patent Application No. 2003-337604, filed Sep. 29, 2003.

BACKGROUND OF THE INVENTION

1. Field of the Invention

The present invention relates to a coating film removal apparatus and a coating film removal method for removing an unnecessary coating film at an edge portion of a quadrangular substrate on which the coating film is formed.

2. Description of the Background Art

In a process for manufacturing a semiconductor device, an exposure mask is formed in the following manner. First, a resist liquid is applied to a quadrangular mask substrate. Then, the resist film is exposed using a photomask and thereafter developed, thus fabricating a desired resist pattern. The resist liquid is applied to the mask substrate using spin coating, however, the resist liquid inevitably has a locally large thickness at a peripheral portion of the substrate, due to surface tension or the like. Accordingly, the resist film at the peripheral portion is not completely removed but left when developed, and the remaining resist peels off while the substrate is conveyed, which results in particles.

In view of the foregoing, after the resist liquid or the like is applied to a surface of the substrate, a treatment for removing an unnecessary coating film at an edge portion outside a pattern forming region on the substrate is carried out. Known examples of such a treatment include a method including the steps of holding a quadrangular substrate on a chuck, moving back and forth an arm portion with a washing block along an edge of the substrate, and removing a resist liquid film using a solvent fed from the arm portion (Japanese Patent Laying-Open No. 11-160891), and a method including the steps of using a carrier arm serving for loading/unloading a substrate in/out of a coating film forming apparatus so as to hold the substrate, and moving back and forth the substrate several times along a coating film removal portion equipped with a solvent feeding portion, so as to remove a resist liquid film (Japanese Patent Laying-Open No. 11-76908).

According to the invention in Japanese Patent Laying-Open No. 11-160891, the arm portion is moved back and forth, a solvent feeding pipe provided in the arm portion feeds a solvent, and a discharge pipe serves for suction and discharge of the solvent and dissolved coating film, so as to remove the coating film at the edge portion of the substrate.

In order to suck the solvent while the arm portion is being moved rapidly for ensuring a throughput so that the solvent fed to the edge portion of the substrate is quickly sucked for preventing introduction into the inner portion of the substrate, a discharge amount should be large, and preferably the discharge pipe has a large diameter. In the arm portion, a plurality of pipes and cables such as the solvent feeding pipe, a purge gas feeding pipe and the discharge pipe are provided in a complicated manner, and a large number of pipes and cables are routed. Accordingly, if the discharge pipe has a large diameter, large tension is applied to the arm portion. In addition, a driving portion with large power is required in order to drive such an arm portion. Further, each pipe or cable of a length adapted to movement of the arm portion should be provided, which also requires a space for routing these pipes and cables.

On the other hand, the discharge pipe bends as the arm portion moves. Depending on a position of the arm portion, however, a degree of bending varies. Hence, a discharge amount fluctuates corresponding to the degree of bending of the discharge pipe, leading to unstable discharge. That is, it has been difficult to remove the coating film in a stable manner.

In order to remove the coating film, the edge portion of the substrate should be moved back and forth a plurality of times with the edge portion lying between the coating film removal portions. According to the invention in Japanese Patent Laying-Open No. 11-76908, however, the substrate is moved by the carrier arm serving for loading/unloading the substrate in/out of the coating film forming apparatus, which means that the carrier arm is dedicated for such a removal operation. Then, its primary operation to carry the substrate itself is suspended, resulting in lower throughput.

Moreover, following problems also arise in addition to the disadvantages described above. It is preferable to provide in the arm portion a plurality of solvent nozzle portions such as a first solvent nozzle portion and a second solvent nozzle portion along a direction in which the substrate is moved forward, instead of providing a single solvent nozzle portion. If the first solvent nozzle portion and the second solvent nozzle portion are provided, for example, the solvent nozzle portion in the front mainly serves to dissolve the coating film, while the solvent nozzle portion in the rear mainly serves to blow away the dissolved coating film. On the other hand, in order to remove the coating film, the arm portion should move back and forth along the edge portion of the substrate a plurality of times. Therefore, a scanning speed of the arm portion should not be too slow to ensure throughput. If a space between the first solvent nozzle portion and the second solvent nozzle portion is too narrow, the dissolved coating film tends to be blown away while dissolving is not sufficiently achieved. Then, a washing effect is lowered, resulting in a larger number of scanning operations of the arm portion. Accordingly, the space between the nozzle portions is set so as not to be smaller than a certain value.

Recently, it has been demanded that a removal width of the coating film at the edge portion of the substrate is partially made larger than normal width. That is, it has been demanded that a removal area of the coating film is partially enlarged toward inside of the substrate. A conventional apparatus, however, has not been able to satisfy such a demand.

SUMMARY OF THE INVENTION

The present invention was made to solve the above-described problems. An object of the present invention is to provide an apparatus and a method for removing a coating film capable of stable treatment for removing an unnecessary coating film at an edge portion of a substrate. Another object of the present invention is to provide an apparatus and a method for removing a coating film, allowing higher degree of freedom in a coating film removal area at the edge portion of the substrate.

A coating film removal apparatus removing an unnecessary coating film at an edge portion of a quadrangular substrate on which the coating film is formed, by blowing a solvent to the edge portion includes: a substrate holding portion holding the substrate horizontally; a registration mechanism clamping opposite sides of the substrate held by the substrate holding portion for achieving registration of the substrate; a movement mechanism moving the substrate holding portion and the registration mechanism in a direction in which other sides except for the opposite sides clamped by the registration mechanism extend; and coating film removal means for feeding a solvent to the edge portions of the other sides and sucking and discharging the solvent and dissolved coating film with a position of the substrate coating film removal means being fixed when the substrate is moved by the movement mechanism.

The registration mechanism may include an approach stage located as high as the substrate, one side of the approach stage being positioned along and proximate to one of the opposite sides of the substrate, and the other side of the approach stage being positioned on an extension line of one of the other sides of the substrate. In this manner, an operation for removing the coating film across the substrate from its side portion to its corner portion can be performed without changing a state of feeding and suction of the solvent. Therefore, linearity in movement of the coating film removal surface at the corner portion of the substrate is improved, and generation of mist can be suppressed. The coating film removal apparatus may further include a forward/backward movement mechanism moving the coating film removal means forward/backward with respect to the substrate. The coating film removal means may include a first solvent nozzle portion and a second solvent nozzle portion provided spaced apart from each other along a direction in which the substrate moves forward, and a space adjustment mechanism adjusting a space between the first solvent nozzle portion and the second solvent nozzle portion. Accordingly, a shape of the coating film removal surface (cut shape) of the substrate can be set with a large degree of freedom.

The coating film removal means may include a first suction and discharge path and a second suction and discharge path provided corresponding to the first solvent nozzle portion and the second solvent nozzle portion respectively. Here, a space between the first suction and discharge path and the second suction and discharge path is adjusted in synchronization with the solvent nozzle portions. In this manner, suction and discharge of the removed coating film can be ensured. In addition, the coating film removal apparatus may further include a forward/backward movement mechanism moving the coating film removal means forward/backward with respect to the substrate. The coating film removal means may include a first solvent nozzle portion and a second solvent nozzle portion provided spaced apart from each other along a direction in which the substrate moves forward, a first valve and a second valve for starting and stopping feeding of a solvent to the first solvent nozzle portion and the second solvent nozzle portion respectively, and a control portion for separately opening and closing the first valve and the second valve. In this case as well, a shape of the coating film removal surface (cut shape) of the substrate can be set with a large degree of freedom.

According to another invention, a method of removing an unnecessary coating film at an edge portion of a quadrangular substrate on which the coating film is formed, by blowing a solvent to the edge portion, includes the steps of: holding the substrate horizontally by means of a substrate holding portion; clamping opposite sides of the substrate held by the substrate holding portion by means of a registration mechanism for achieving registration of the substrate; moving the substrate holding portion and the registration mechanism in a direction in which other sides except for the opposite sides clamped by the registration mechanism extend; and feeding a solvent to the edge portions of the other sides from a solvent nozzle portion of which position is fixed and sucking and discharging the solvent and dissolved coating film during the step of moving.

The coating film removal apparatus is fixed and the substrate is moved, whereby a state of the pipe provided in the removal apparatus is always maintained constant. Accordingly, stable removal of the coating film at the edge portion of the substrate can be achieved. In addition, as large tension is not applied to the pipe and the removal apparatus is fixed, the pipe can be short. The discharge pipe can have a large diameter, and the coating film can rapidly be removed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a perspective view showing a back side of the arm portion in the embodiment of the present invention.

DESCRIPTION OF THE PREFERRED EMBODIMENTS

Figure 1:
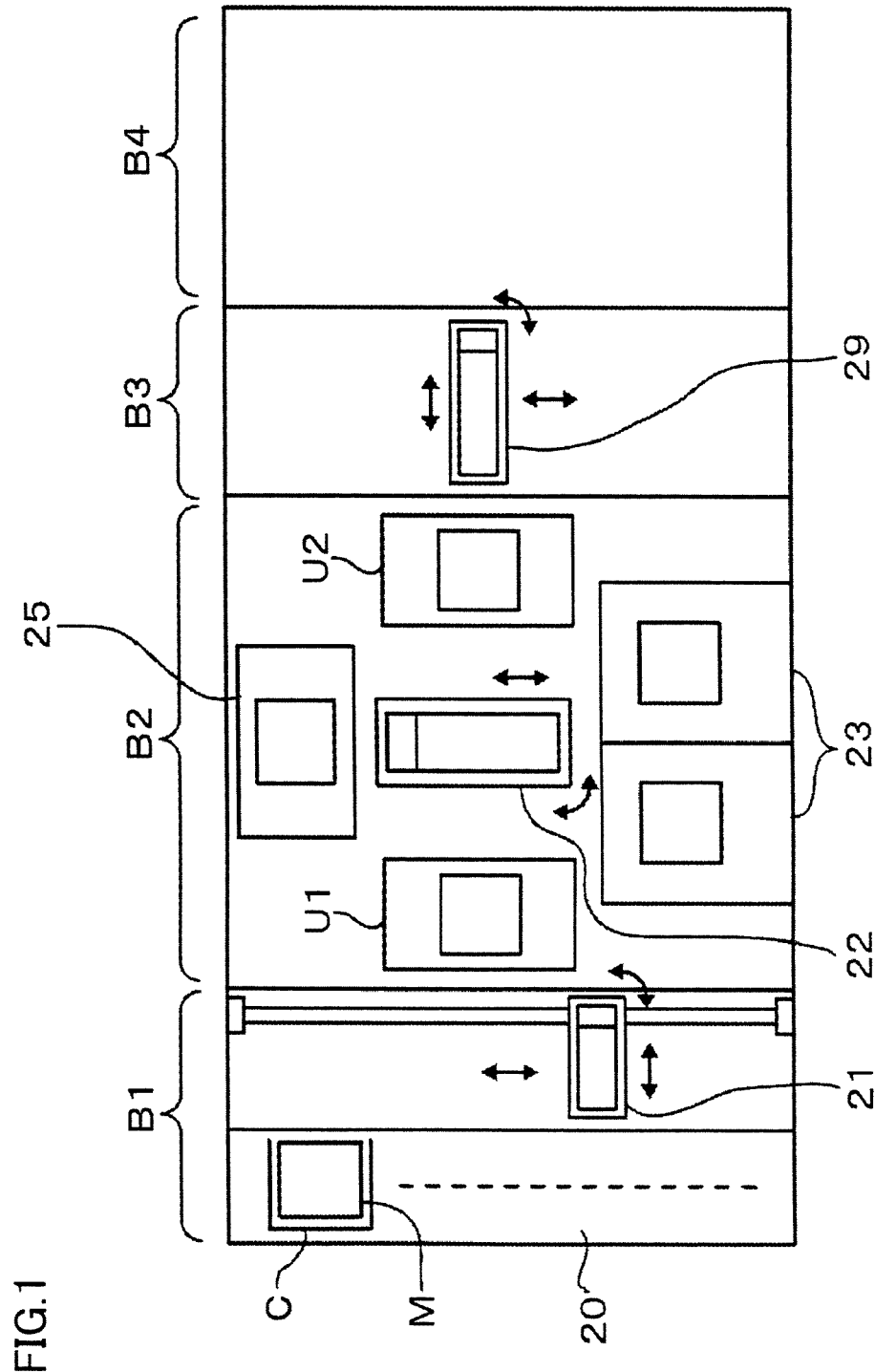
FIGS. 1 and 2 are schematic views of a semiconductor manufacturing apparatus in an embodiment of the present invention.
Figure 2:
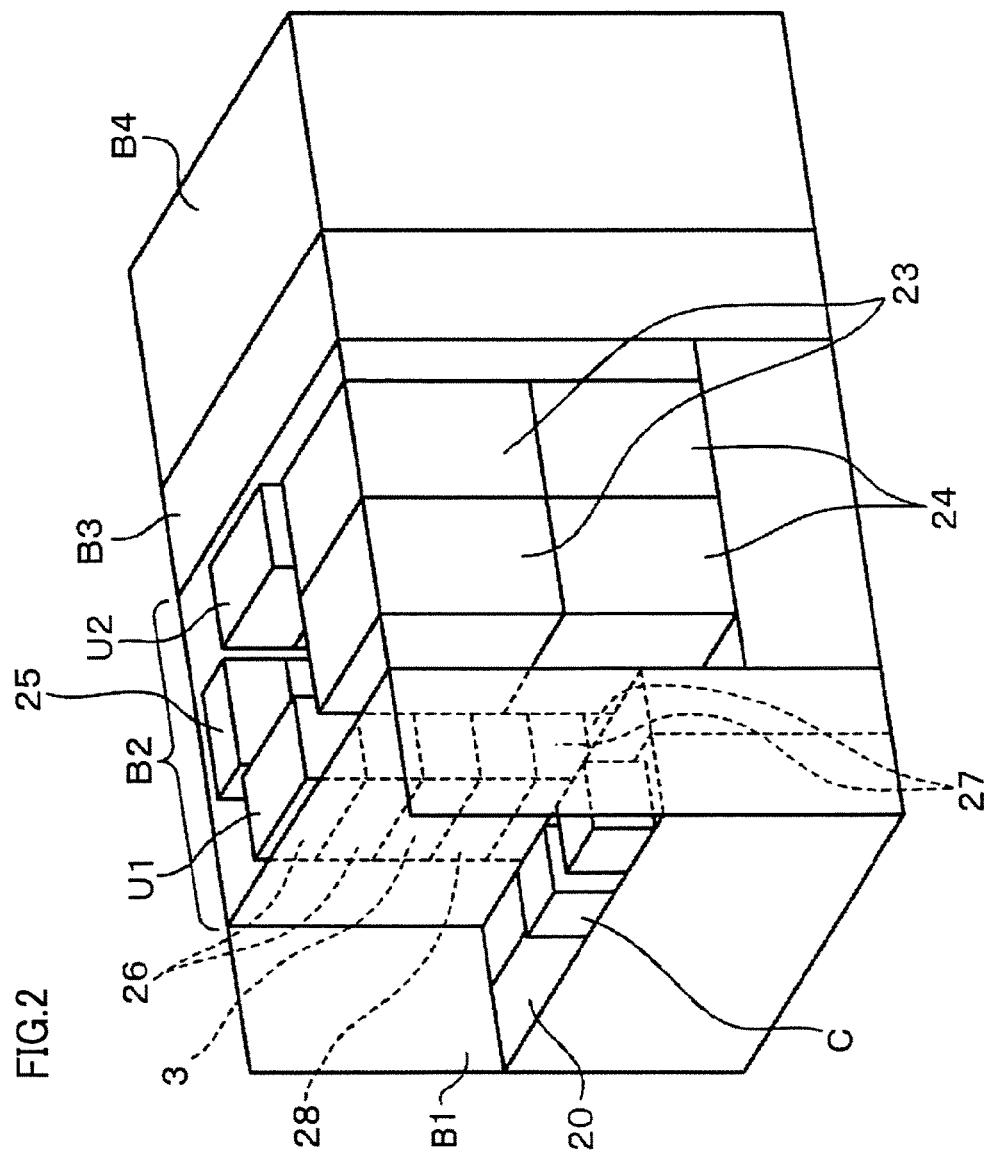

Initially, an overall configuration of a coating film forming system incorporating the coating film removal apparatus according to the present invention will briefly be described. FIG. 1 is a plan view showing one example of the coating film forming system, and FIG. 2 is a schematic perspective view of the same. In the figures, reference character B1 represents a carrier block for loading/unloading a carrier C accommodating, for example, five quadrangular substrates such as rectangular mask substrates M. Carrier block B1 includes a carrier mount portion 20 for mounting carrier C and delivery means 21.

Mask substrate M is a glass substrate for forming an exposure mask, for example. For example, mask substrate M is in a square shape of which side has a length of 152±0.5 mm each, and has a thickness of 6.35 mm. Delivery means 21 is configured to be capable of left-right, front-rear and up-down movement as well as pivot around a vertical axis, in order to take out substrate M from carrier C and deliver taken-out substrate M to a treatment portion B2 provided in the back of carrier block B1.

Main carrier means 22 is provided in the center of treatment portion B2. When viewed from carrier block B1, for example, main carrier means 22 is surrounded by an application unit 23 and a development unit 24 on the right, a washing unit 25 on the left, and shelf units U1, U2 implemented by stacking multiple units such as heating and cooling units in the front and back sides. Application unit 23 serves for a treatment to apply the resist liquid to substrate M. Development unit 24 carries out a development treatment by applying a developer to substrate M after exposure and leaving the substrate as it is for a prescribed time period. Washing unit 25 serves to wash substrate M before the resist liquid is applied.

Shelf units U1, U2 are implemented by stacking multiple units. As shown in FIG. 2, for example, a coating film removal apparatus 3, a heating unit 26, a cooling unit 27, and a delivery unit 28 of substrate M are arranged vertically. Main carrier means 22 is configured to be capable of front-rear and up-down movement as well as pivot around a vertical axis, and serves to carry substrate M among shelf units U1, U2 and application unit 23, development unit 24, and washing unit 25. It is noted that delivery means 21 and main carrier means 22 are not shown in FIG. 2 for the sake of convenience.

Treatment portion B2 is connected to an exposure apparatus B4 with an interface portion B3 being interposed. Interface portion B3 includes delivery means 29, which is configured to be capable of left-right, front-rear and up-down movement as well as pivot around a vertical axis. Delivery means 29 serves to deliver substrate M between treatment block B2 and exposure apparatus B4.

Flow of substrate M in such a coating film forming apparatus will be described. First, carrier C is externally loaded into carrier mount portion 20, and delivery means 21 takes out substrate M from carrier C. Substrate M is sequentially delivered from delivery means 21 through delivery unit 28 in shelf unit U1 to the main carrier means, and further to a prescribed unit. For example, substrate M is subjected to a prescribed washing treatment in washing unit 25, and to a heating treatment in one heat treatment unit. Thereafter, a temperature of substrate M is adjusted to a prescribed temperature in cooling unit 27, and substrate M is then subjected to application treatment of the resist liquid which is a coating liquid obtained by dissolving a coating film component in the solvent in application unit 23.

Successively, an unnecessary resist film adhered to the edge portion of substrate M is removed in coating film removal apparatus 3. Here, the edge portion of substrate M refers to a peripheral area outside a pattern forming region on substrate M as well as a substrate end surface. Thereafter, substrate M is heated to a prescribed temperature for pre-baking in one heating unit 26, and the temperature thereof is adjusted to a prescribed temperature in one cooling unit 27. Then, substrate M is delivered to delivery means 29 in interface portion B3 through delivery unit 28 in shelf unit U2 by main carrier means 22, and conveyed to exposure apparatus B4 by delivery means 29, in which substrate M is subjected to a prescribed exposure treatment. Thereafter, substrate M is conveyed to treatment portion B2 through interface portion B3, and heated to a prescribed temperature in one heating unit 26 for post-exposure baking. Then, substrate M is cooled to a prescribed temperature in cooling unit 27 for temperature adjustment. Thereafter, the developer is applied to the substrate in development unit 24 for a prescribed development treatment. Substrate M having a prescribed circuit pattern thus formed returns to original carrier C, for example, through main carrier means 22 and delivery means 21 in carrier block B1.

Figure 3:
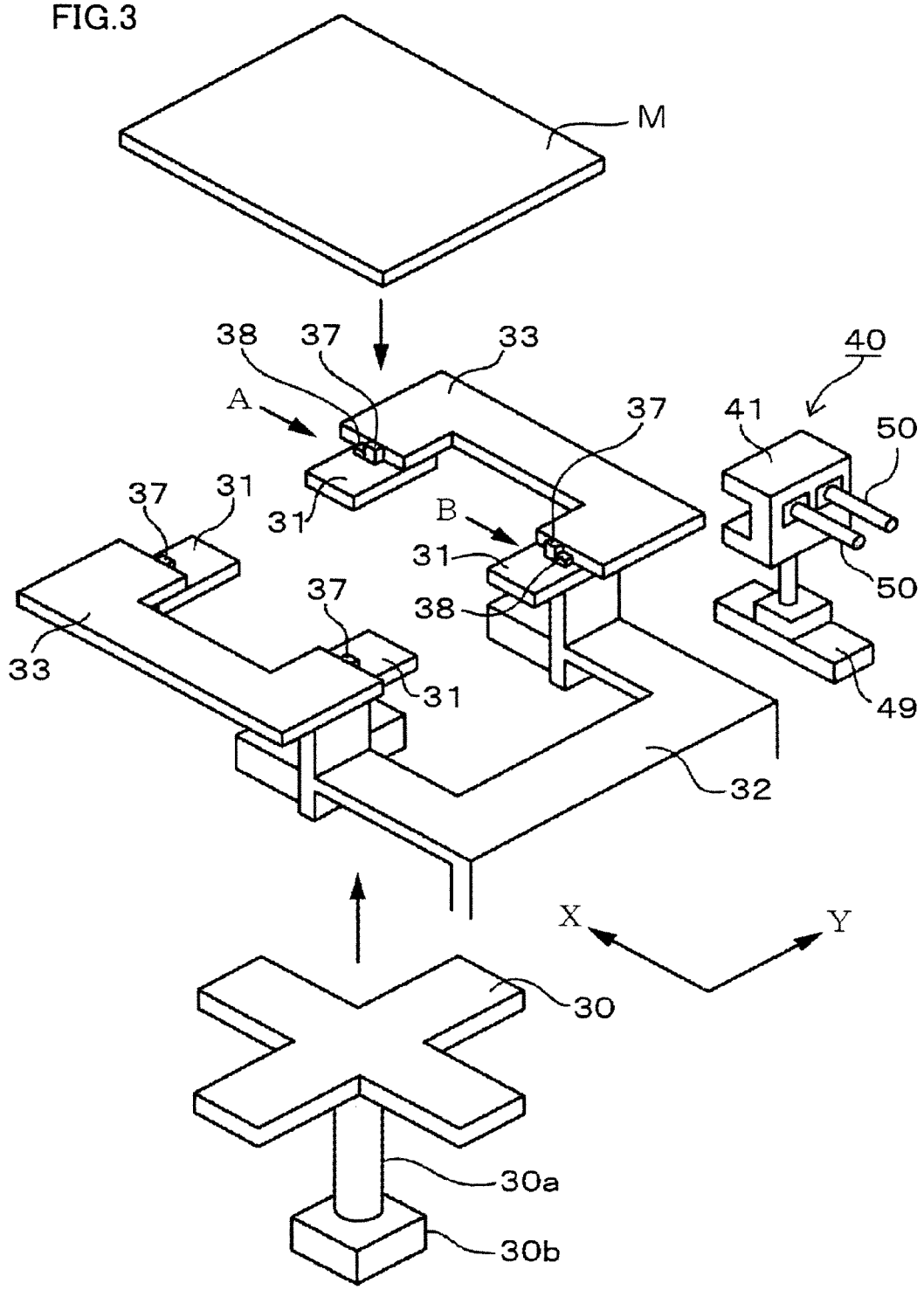
FIG. 3 is a perspective view showing a portion of a coating film removal apparatus in the embodiment of the present invention.
Figure 10A:
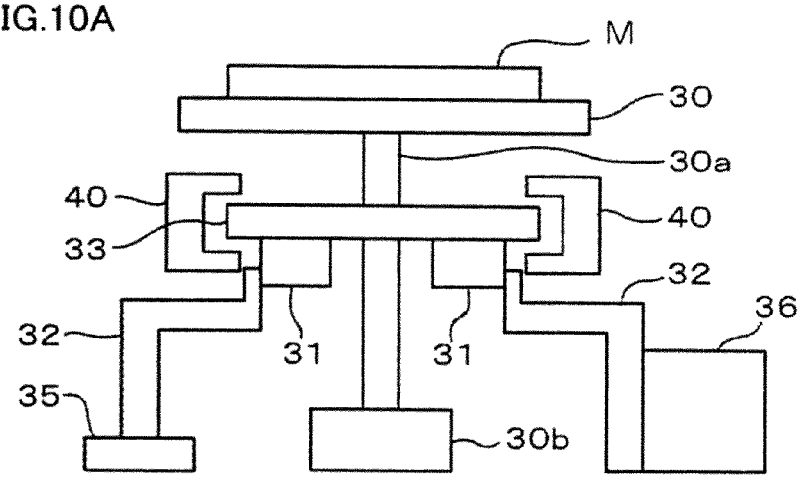
FIG. 10A is a side view showing a manner how the substrate is mounted in the coating film removal apparatus in the embodiment of the present invention.
Figure 10B:
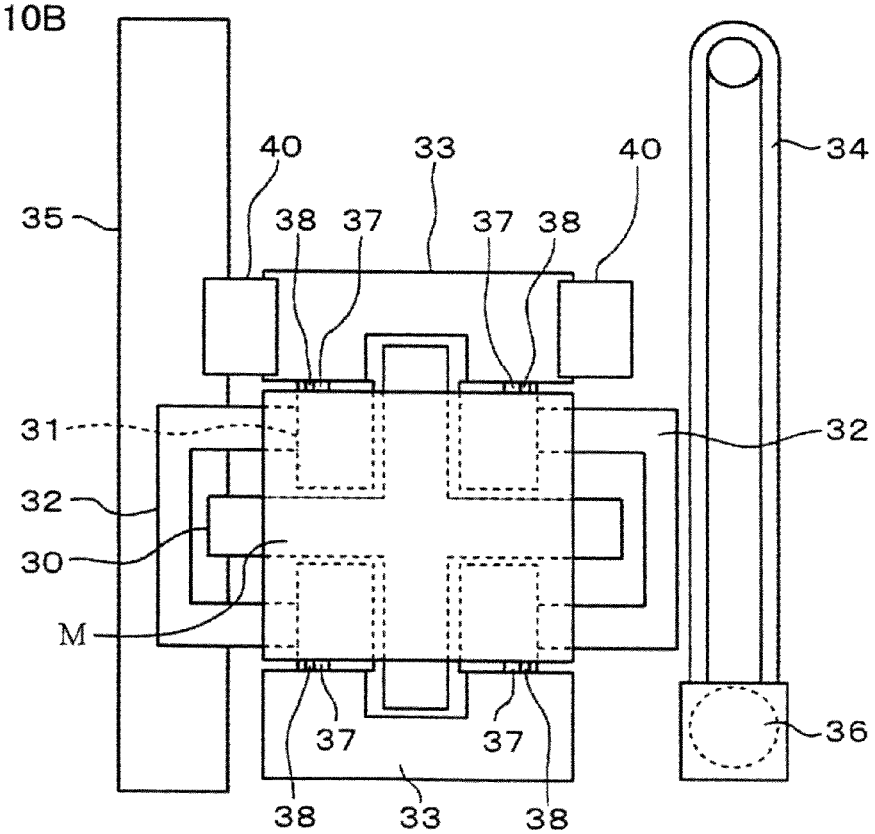
FIG. 10B is a plan view showing a manner how the substrate is mounted in the coating film removal apparatus in the embodiment of the present invention.

Coating film removal apparatus 3 according to the present invention will now be described with reference to FIG. 3 and FIGS. 10A and 10B used for illustrating a working manner. FIG. 3 is an exploded perspective view showing a portion of coating film removal apparatus 3. FIGS. 10A and 10B are schematic side view and plan view of coating film removal apparatus 3, respectively. Coating film removal apparatus 3 mainly includes a delivery chuck 30 delivering substrate M to main carrier means 22 and loading/unloading substrate M to/from coating film removal apparatus 3, a chuck (mount base) 31 on which substrate M is mounted by means of delivery chuck 30, a body portion 32 to which chuck 31 is fixed, an approach stage 33 serving for registration of substrate M for fixing the same when the coating film on the surface of substrate M is removed, and an arm portion 40 serving as a washing unit to feed the solvent, which is a washing liquid, to substrate M in removing the coating liquid as well as to suck and discharge the solvent and dissolved coating film. In addition, a forward/backward movement mechanism 49 allowing arm portion 40 to move forward and backward with respect to substrate M is provided below arm portion 40. A manner of using forward/backward movement mechanism 49 will be described in detail later.

When viewed two-dimensionally, delivery chuck 30 is shaped like a cross. Delivery chuck 30 has a columnar shaft 30a extending downward under its center portion. At a lowermost position of shaft 30a, a driving portion allowing up-down movement and pivot around the vertical axis of delivery chuck 30 is provided. Delivery chuck 30 is configured not to two-dimensionally interfere with chuck 31. More specifically, when substrate M unloaded from application unit 23 is loaded from the side of coating film removal apparatus 3 in a Y direction, substrate M is mounted on the upper surface of delivery chuck 30, and thereafter delivery chuck 30 is lowered so as to deliver substrate M onto the upper surface of chuck 31. Meanwhile, when substrate M is unloaded from coating film removal apparatus 3, delivery chuck 30 is elevated, receives substrate M that has been mounted on chuck 31, and is further elevated. In this manner, substrate M leaves the removal apparatus, and moves to the next step. When delivery chuck 30 is elevated, delivery chuck 30 is pivoted around the vertical axis, so that substrate M is turned and a side from which the coating film on the substrate is to be removed can be changed.

In the upper portion of chuck 31, support portions 38 supporting a bottom surface of substrate M that has been conveyed in the removal apparatus are provided.

Body portion 32 is provided with approach stage 33 described later, in addition to chuck 31 on which substrate M is mounted. In addition, a belt 34 and a guide 35 are provided so as to extend in a front-rear direction as shown in FIG. 10A on left and right side of body portion 32. Belt 34 is fixed to body portion 32, and runs around not-shown driving pulley and driven pulley. When a motor 36 operates, the driving pulley is driven to operate belt 34. Then, belt 34 is guided by guide 35, and substrate M is allowed to move in the front-rear direction, that is, in the Y axis direction.

Approach stage 33 consists of a pair of members, the member being a plate having a cup shape when viewed two-dimensionally. Approach stage 33 is provided on the uppermost portion of body portion 32 so as to face with each other in the front-rear direction (Y axis direction). A not-shown driving mechanism is provided on a lower surface of approach stage 33. When two approach stages 33 located on opposing sides of substrate M operate so as to clamp substrate M in the Y axis direction in FIG. 3, that is, a direction of loading/unloading substrate M, the edge portions of substrate M are supported by support portions 38 and substrate M is fixed by spacers 37.

In a portion inside with respect to coating film removal apparatus 3 of approach stage 33, two spacers (positioning members) 37 positioning and fixing substrate M on chuck 31 are provided on the left and right respectively for each approach stage 33, that is, four spacers are provided in total.

Arm portion 40 is provided at a height substantially the same as that of approach stage 33 in the back in the Y direction in the figure, that is, in the direction in which substrate M moves. When substrate M moves into the vicinity of arm portion 40, removal of the coating film on the edge portion of the substrate is performed.

In FIG. 3, a portion of chuck 31 and body portion 32 is not shown. Actually, however, as shown in the plan view of coating film removal apparatus 3 in FIG. 10B, similar body portion 32 and chuck 31 are provided also on the opposite side, with approach stage 33 lying therebetween.

Figure 4A:
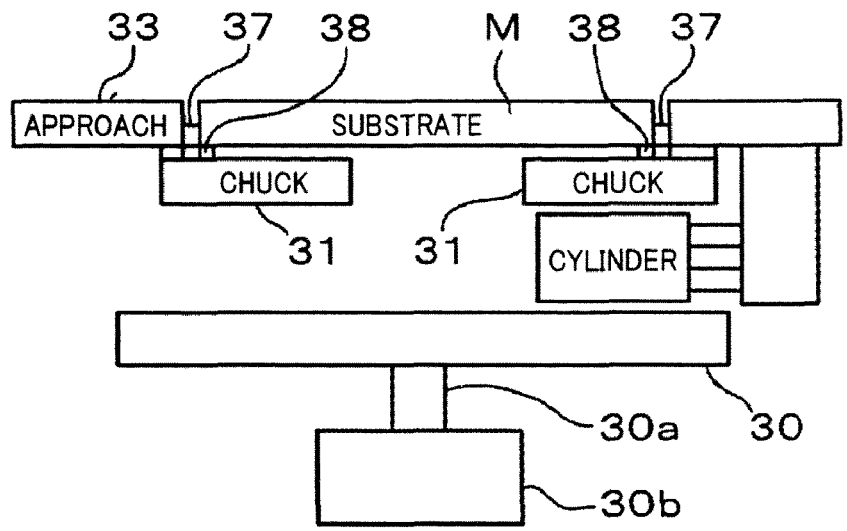
FIGS. 4A to 4C illustrate a fixed state of a substrate on a chuck in the embodiment of the present invention.
Figure 4B:
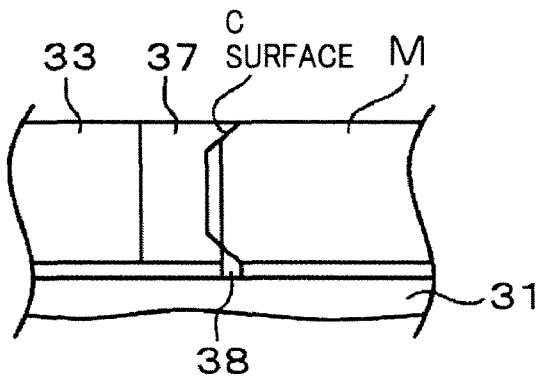
Figure 4C:
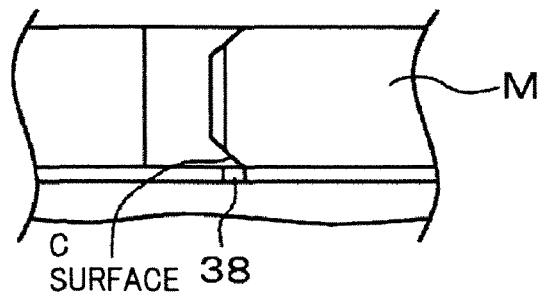

FIGS. 4A to 4C show a manner how substrate M held on chuck 31 is clamped by approach stages 33 with spacers 37 being interposed for positioning. FIG. 4B shows a view from a direction shown with an arrow A in FIG. 3, while FIG. 4C shows a view from a direction shown with an arrow B in FIG. 3. At the end surface of substrate M, inclined surfaces (C surfaces) obtained by beveling both upper and lower corners are formed, so as to leave a vertical edge between upper and lower C surfaces. Spacer 37 has such a cross sectional shape that its inner side surface is inwardly inclined so as to form a recess as shown in FIGS. 4B and 4C. The cross sectional shape of spacer 37 is made to substantially match with the shape of the end surface of substrate M, and to be in contact solely with the C surface. The upper surface of support portion 38 is inclined at an angle similar to that of spacer 37. Accordingly, when substrate M is mounted on chuck 31 from delivery chuck 30, support portion 38 can support the inclined surface (C surface) at the end portion of substrate M. Registration of substrate M is achieved in such a manner that substrate M is oriented in a prescribed direction with a small space above chuck 31, by clamping the inclined surfaces at both ends of the substrate in the Y axis direction in FIG. 3 by means of opposing spacers 37. Here, a space between substrate M and approach stage 33 is set to 0.3 to 1.0 mm.

Figure 5:
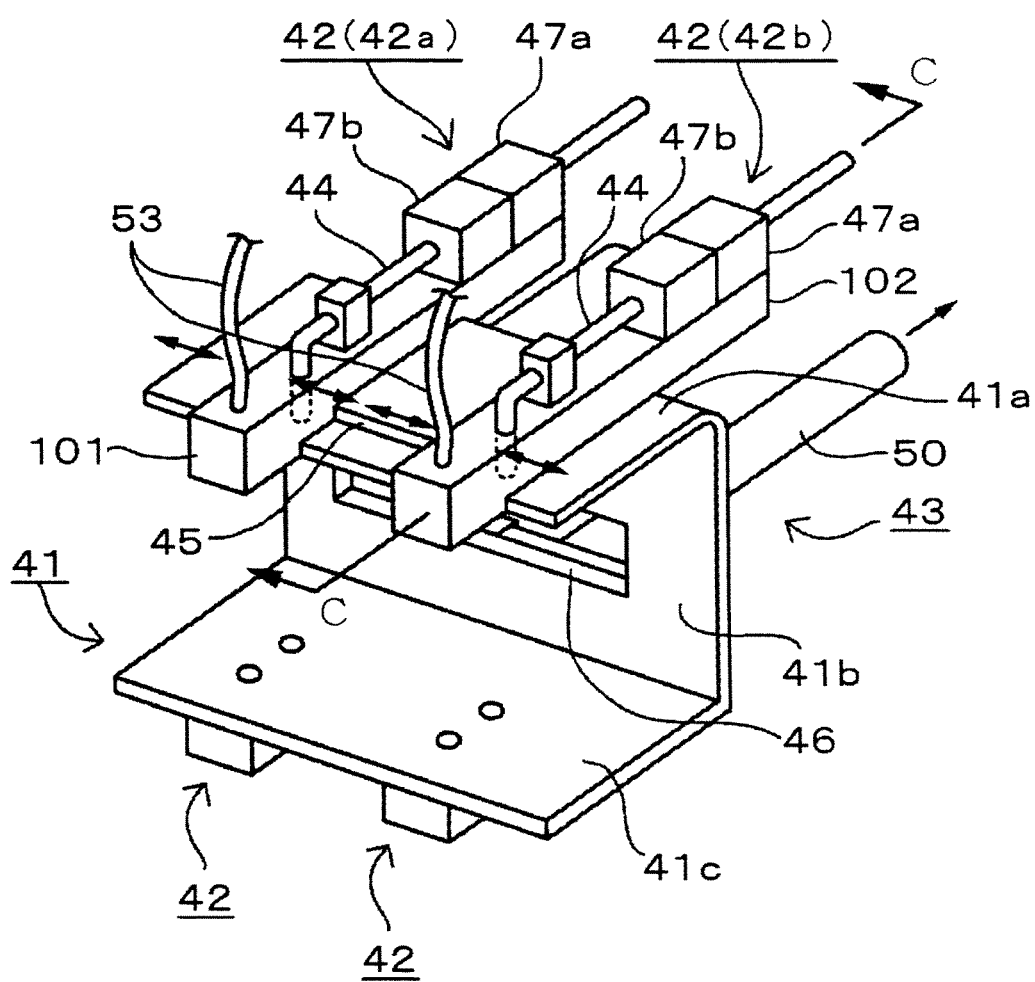
FIG. 5 is a perspective view showing a portion of an arm portion in the embodiment of the present invention.
Figure 6:
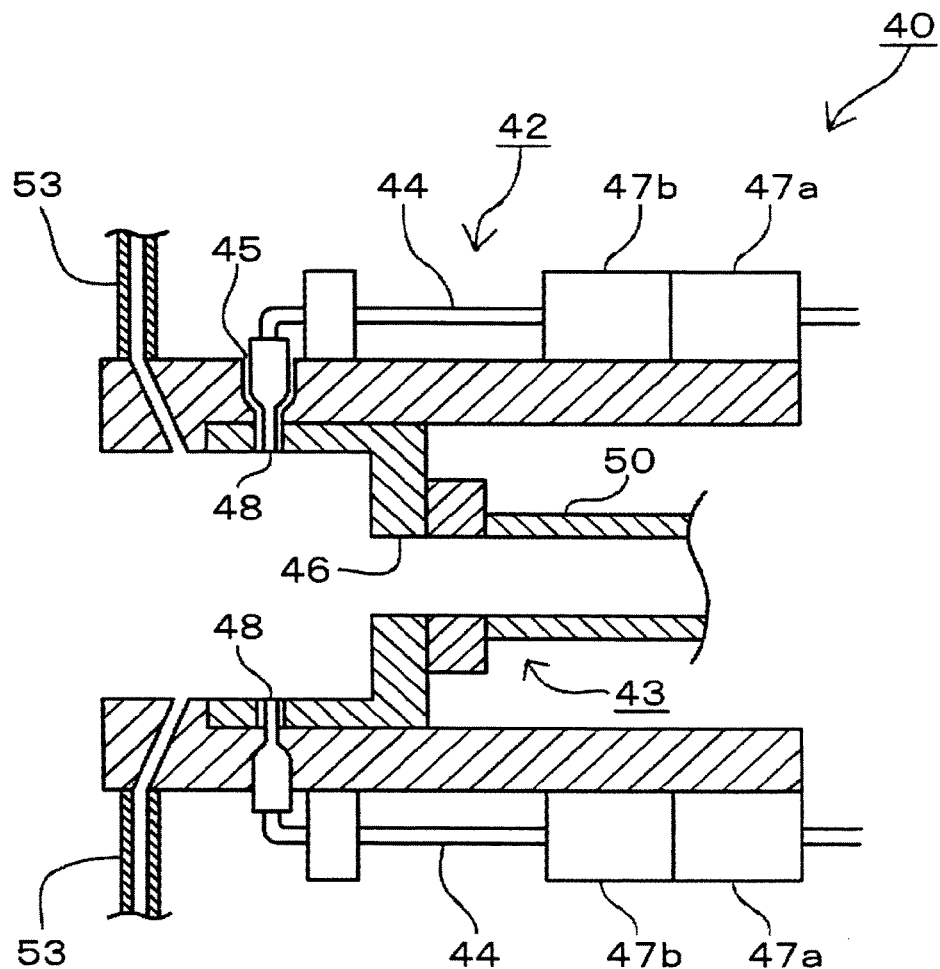
FIG. 6 is a cross sectional view along the line C-C, showing a portion of the arm portion in the embodiment of the present invention.

Arm portion 40 serving as coating film removal means for removing the coating film at the edge portion of the substrate M by feeding the solvent thereto will now be described with reference to FIGS. 5 to 10B. FIG. 5 is a schematic perspective view when arm portion 40 is viewed from the front, FIG. 6 is a cross-sectional view along the line C-C in FIG. 5, in which some portions are not shown, and FIG. 7 is a perspective view when viewed from the back of arm portion 40.

As shown in FIG. 10B, arm portions 40 are positioned along the sides of substrate M in a direction in which substrate M moves. Each arm portion 40 includes a base body 41 shaped like a cup when viewed from the side, a nozzle portion 42 feeding the solvent for dissolving the coating film and a purge gas blowing away dissolved coating film and excessive solvent, and a discharge portion 43 serving as suction and discharge means for sucking and discharging the solvent fed from nozzle portion 42, and the removed coating film and solvent.

Figure 9:
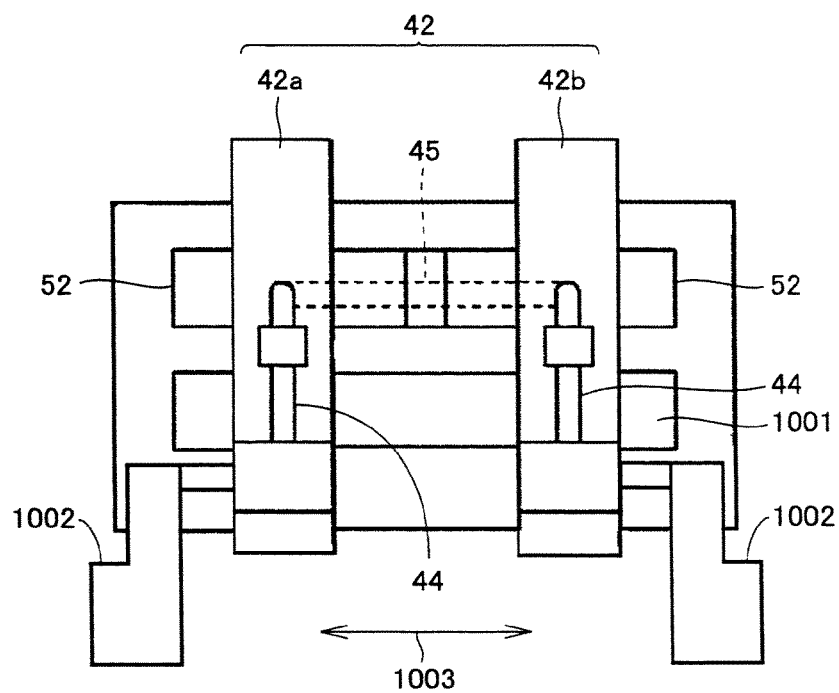
FIG. 9 is a schematic plan view of the arm portion in the embodiment of the present invention.

Base body 41 consists of an upper piece 41a, a lower piece 41b, and a wall portion 41c. As shown in FIG. 9, upper piece 41a has a nozzle hole 45 which is an elongated hole extending in the front-rear direction of substrate M, through which nozzle portion 42 described later passes. As shown in FIGS. 6 and 7, a substantially rectangle discharge hole 46 connecting to discharge portion 43 described later is formed in the approximately central portion of wall portion 41c. In addition, when the coating film is removed, substrate M is introduced in the space between upper piece 41a and lower piece 41b, so as to simultaneously remove the coating film on opposing two edge portions of substrate M.

Two nozzle portions 42 (42a, 42b) are provided in parallel along the direction in which substrate M moves, in an upper portion of upper piece 41a. Here, nozzle portions 42a, 42b correspond to the first solvent nozzle portion and the second solvent nozzle portion respectively. Each nozzle portion 42a, 42b mainly includes a feeding pipe 44 through which the solvent flows, a feed control portion controlling feeding of the solvent to substrate M, that is, a gas operation valve 47a in this case, and a suck back valve 47b. A tip end portion of feeding pipe 44 is bent downward, so as to pass through nozzle hole 45 and to face substrate M. Nozzle portions 42a, 42b are attached to a movable bases 101, 102 respectively. Movable bases 101, 102 can be moved by a not-shown driving mechanism in a direction shown with an arrow in FIG. 5, that is, the direction in which substrate M is moved. Accordingly, the space between nozzle portions 42a, 42b can be adjusted in a range from 5 mm to 30 mm. In this example, movable bases 101, 102 and the not-shown driving mechanism implement a space adjustment mechanism for nozzle portions 42a, 42b. In addition, feeding pipe 44, gas operation valve 47a, and suck back valve 47b are fixed to nozzle portion 42 by a not-shown fixing member. Here, similar solvents are fed to both nozzle portions 42a, 42b serving as the first and second solvent nozzle portions.

A purge gas feeding pipe 53 serving as a purge gas feeding portion feeding a purge gas to the surface of substrate M in order to promote discharge in removing the coating film as well as to promote drying of substrate M is provided in upper piece 41a. When the coating film is removed, a nitrogen gas, for example, is fed to the surface of substrate M as the purge gas.

Figure 17:
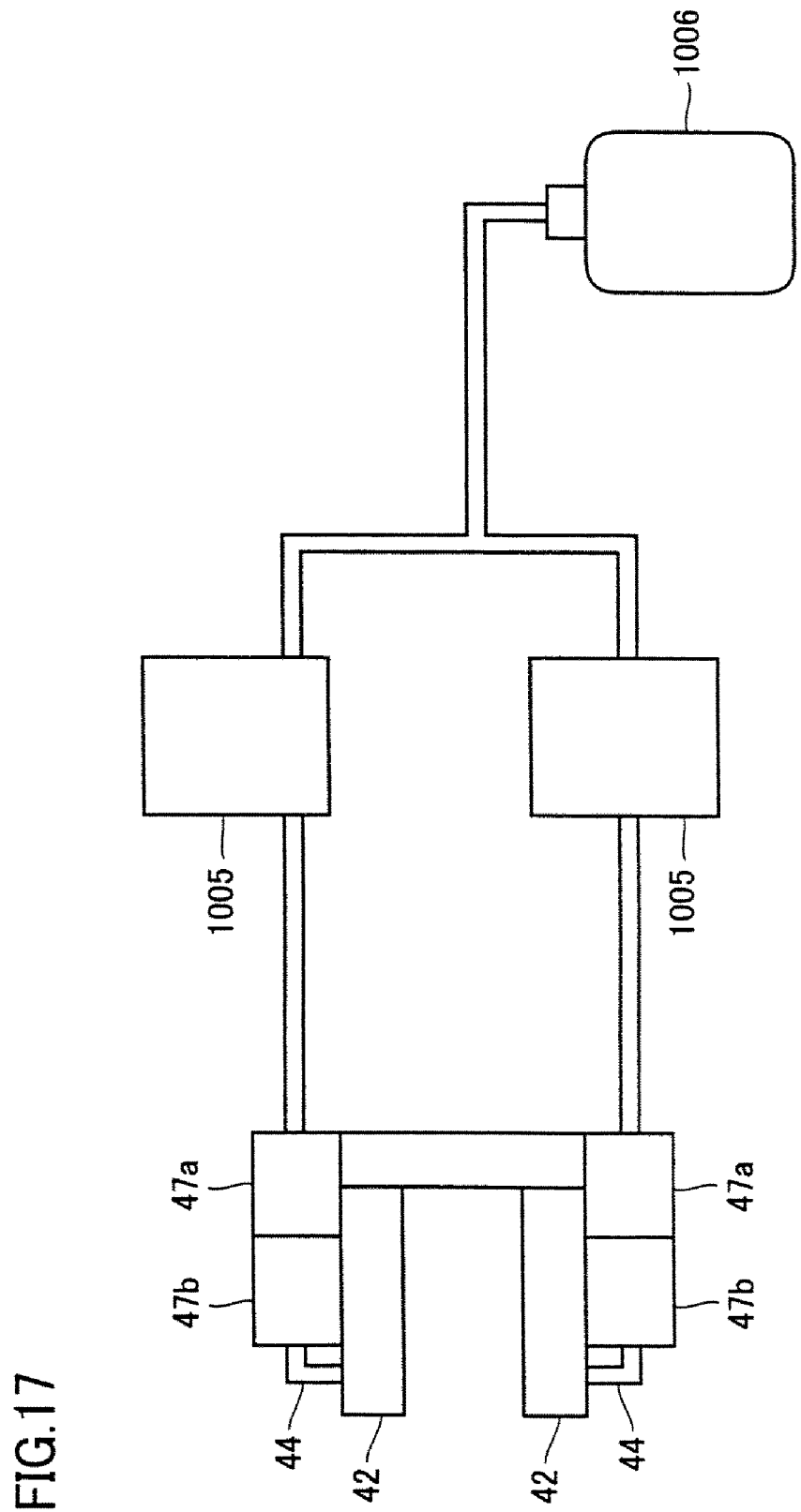
FIG. 17 illustrates flow of a solvent.

FIG. 17 shows flow of the solvent. As shown in FIG. 17, the solvent constantly flows into feeding pipe 44 with a constant pressure from a chemical bottle 1006 serving as a solvent feeding portion, and a feed amount of the solvent is adjusted by a mass flow controller 1005. Gas operation valve 47a controls ON/OFF of solvent feed. Even after gas operation valve 47a has stopped feeding of the solvent, the solvent continues to flow because a residual pressure is applied from gas operation valve 47a to the tip end of nozzle 42. That is, delay in stopping the flow is caused. Suck back valve 47b is used in order to release the residual pressure and to stop the flow immediately. As shown in FIG. 6, nozzle portions 42a, 42b are provided, for example, in a fixed manner also in the lower portion of lower piece 41c. Therefore, the coating film removed from the upper surface of substrate M is prevented from reaching the lower surface side, and the coating film adhered to the back surface of substrate M can be removed.

As shown in FIG. 7, discharge portion 43 includes two discharge pipes 50 (50a, 50b) arranged in parallel and connecting to discharge hole 46, and a cover plate 51. In this example, one discharge pipe 50a and the other discharge pipe 50b correspond to the first discharge pipe and the second discharge pipe, respectively. In addition, a not-shown discharge pump is provided on an upstream side of discharge pipe 50, so as to suck and discharge an exhaust (such as the solvent) within arm portion 40. Discharge pipe 50 can move along the direction in which substrate M moves by a not-shown guide mechanism. For example, discharge pipes 50 are coupled to respective movable bases 101, 102 of nozzle portions 42a, 42b by a not-shown coupling member, and operate in synchronization with an operation of nozzle portions 42a, 42b in a direction shown with an arrow in FIG. 7, that is, a longitudinal direction of the discharge hole.

A junction of discharge pipe 50 to base body 41 is joined by cover plate 51 extending in a longitudinal direction of discharge hole 46. Therefore, even when discharge pipes 50a, 50b move in the left-right direction (in a direction shown with an arrow in the figure), discharge hole 46 is not exposed. In this manner, useless suction by discharge pipes 50a, 50b through discharge hole 46 (suction of air coming from the back surface side of base body 41) is prevented, thereby ensuring discharge of the solvent from discharge pipe 50. In the present embodiment, an upper portion of cover plate 51 on the right in the figure is bent in an L-shape by a length comparable to a thickness of the cover plate, so that a portion of cover plate 51 on the left is accommodated inside cover plate 51 on the right even when the space between discharge pipes 50 is made narrower. Accordingly, a gap will not be produced with respect to discharge hole 46.

Figure 8A:
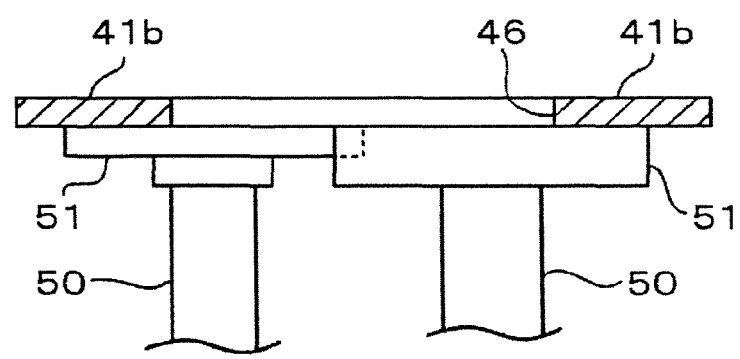
FIGS. 8A to 8B illustrate a manner that a discharge hole is not exposed due to a discharge pipe.
Figure 8B:
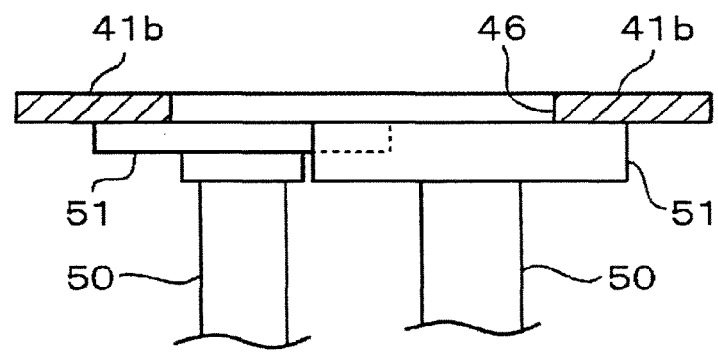

FIGS. 8A to 8B show a manner how discharge pipes 50a, 50b are moved in synchronization with nozzle portions 42a, 42b in the direction shown with the arrow in FIG. 7. FIG. 8A shows a state in which the space between discharge pipes 50 is widest, while FIG. 8B shows a state in which the space between discharge pipes 50 is narrowest. As can be seen from the figures, regardless of the wide or narrow space between discharge pipes 50, discharge hole 46 is not exposed nor useless suction through discharge hole 46 does not take place.

The junction of discharge pipe 50 to base body 41 is made such that the exhaust does not leak to the outside through discharge hole 46 by virtue of cover plate 51. Meanwhile, a cover member 52 extending in a longitudinal direction of nozzle hole 45 may be provided in nozzle portion 42 around feeding pipe 44 as shown in FIG. 9, so as to cover a gap (nozzle hole 45) produced by movement of nozzle portion 42. First nozzle portion 42a and second nozzle portion 42b are provided on a guide 1001, and moved in a direction shown with an arrow 1003 by a space adjustment mechanism 1002 implemented by an air cylinder or a motor, so as to adjust the space therebetween.

Figure 11A:
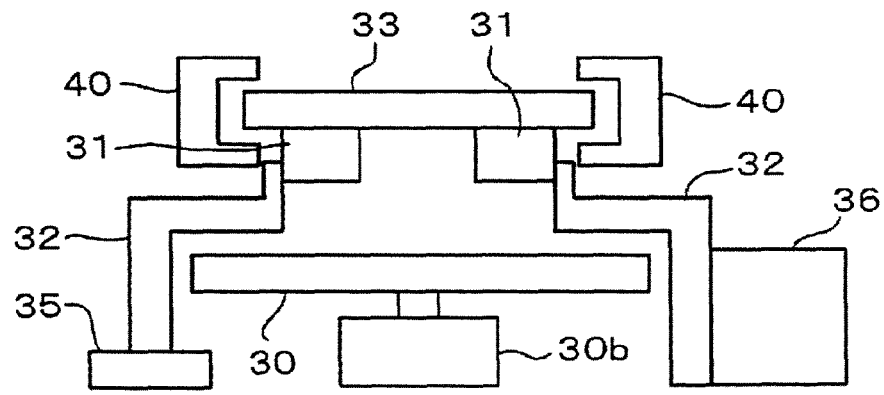
FIG. 11A is a side view of the substrate mounted in the coating film removal apparatus in the embodiment of the present invention.

A method of removing the coating film at the edge portion of the substrate in the present embodiment will now be described with reference to FIGS. 10A to 12B. FIGS. 10A, 11A and 12A show schematic side views of coating film removal apparatus 3, while FIGS. 10B, 11B and 12B show schematic plan views of the same.

FIGS. 10A to 10B shows a manner how substrate M is delivered to coating film removal apparatus 3. In a state in which delivery chuck 30 is located in the upper portion of coating film removal apparatus 3, substrate M is conveyed from application unit 23 to coating film removal apparatus 3 by main carrier means 22 described above, and then mounted on delivery chuck 30.

Figure 11B:
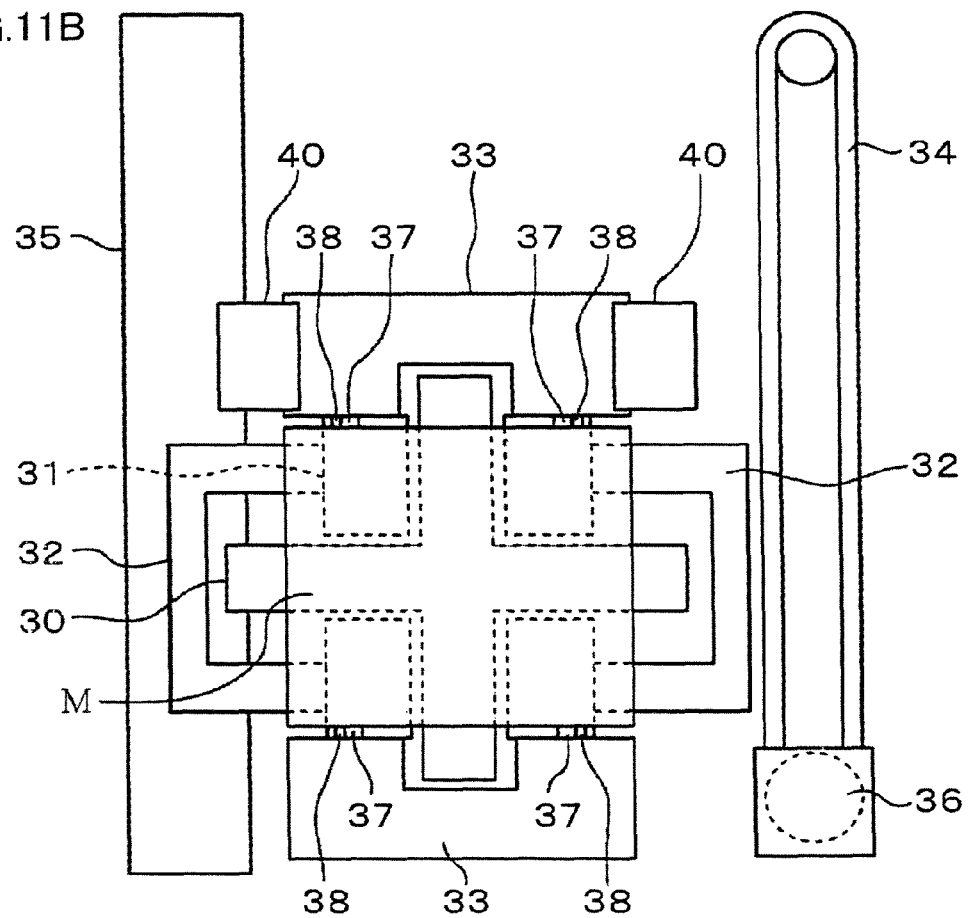
FIG. 11B is a plan view of the substrate mounted in the coating film removal apparatus in the embodiment of the present invention.
Figure 12A:
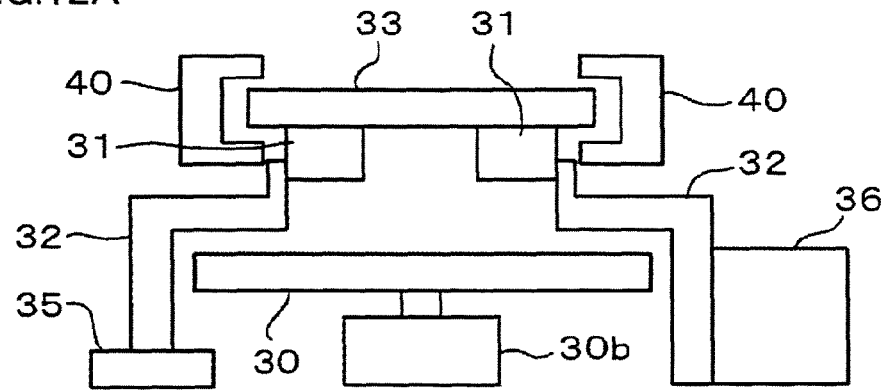
FIG. 12A is a side view showing a manner how a coating film at an edge portion of the substrate is removed in the embodiment of the present invention.

FIGS. 11A to 11B show a state after substrate M is delivered to coating film removal apparatus 3. When substrate M is mounted on delivery chuck 30, delivery chuck 30 is lowered by an operation of a driving portion 30b, so as to deliver and mount substrate M onto support member 38 on chuck 31. After substrate M is mounted on chuck 31, delivery chuck 30 is further lowered to a position not interfering the operation of coating film removal apparatus 3.

Figure 12B:
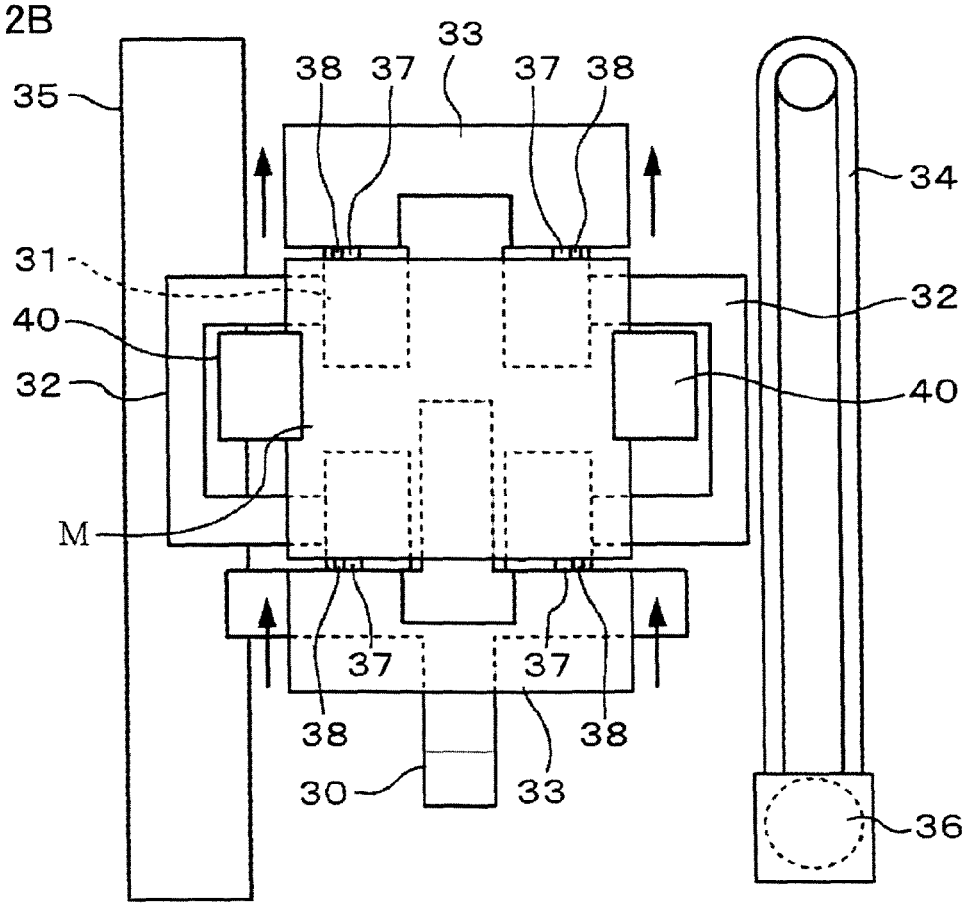
FIG. 12B is a plan view showing a manner how the coating film at the edge portion of the substrate is removed in the embodiment of the present invention.

FIGS. 12A to 12B show a manner how the coating film at the edge portion of the substrate is removed. When substrate M is mounted on chuck 31, one approach stage 33 moves so as to push substrate M toward the other approach stage 33 by a not-shown air cylinder. Spacers 37 on both approach stages 33 press the above-described inclined surfaces at the ends of substrate M, so as to clamp substrate M. Therefore, substrate M is set in a predetermined orientation, that is, in such a orientation that a direction of forward movement of substrate M matches with high accuracy with the direction in which left and right sides of substrate M extend.

When substrate M is fixed on chuck 31 in the above-described manner, a unit portion except for arm portion 40 and delivery chuck 30, that is, body portion 32 including approach stage 33 and chuck 31, holds substrate M in the upper portion, and moves in the direction shown with the arrow in the figure, that is, along the sides other than the clamped sides (left and right sides) of the substrate. When the edge portion of substrate M enters a space between upper piece 41a and lower piece 41b of arm portion 40, removal of the coating film at the edge portion of the substrate is started. By that time, a position of arm portion 40 is set by forward/backward movement mechanism 49, in accordance with a predetermined removal width of the coating film from the edge portion of the substrate.

Figure 13:
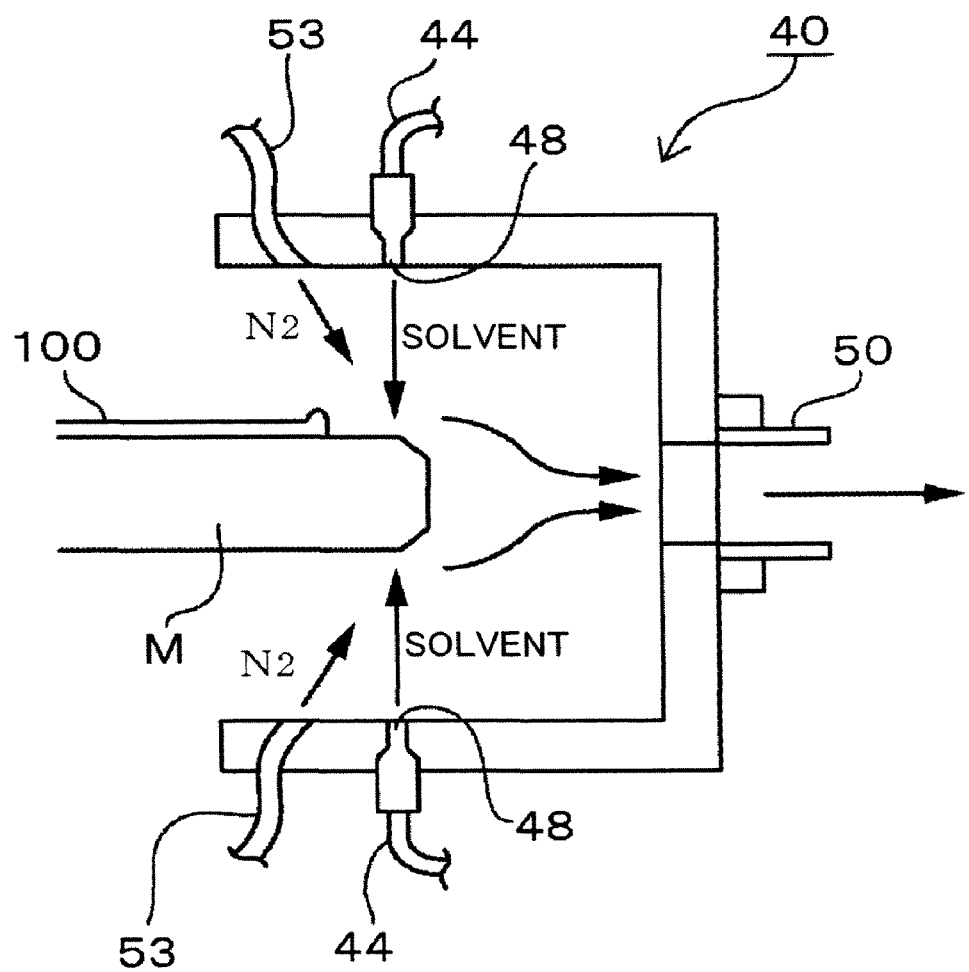
FIG. 13 illustrates a manner how the coating film at the edge portion of the substrate is removed in the embodiment of the present invention.

According to the method of removing the coating film in the present embodiment, as shown in FIG. 13, the solvent is fed through a feeding hole 48 of nozzle portions 42 (42a, 42b) to a target portion from which a coating film 100 on the surface of substrate M is to be removed, so as to dissolve coating film 100. The dissolved coating film (liquid) and the solvent are sucked and discharged through discharge pipe 50, so as to remove coating film 100 from the surface of substrate M. In this case, first nozzle portion 42a positioned in the front side in the direction in which substrate M moves forward mainly serves to dissolve coating film 100, and second nozzle portion 42b positioned in the rear side mainly serves to blow away the dissolved coating film.

In addition, the nitrogen gas is blown through purge gas feeding pipe 53 to a position in the vicinity of the removal target portion of coating film 100 on the surface of substrate M, so as to promote discharge of the solvent and the dissolved coating film. Moreover, the nitrogen gas also promotes drying of substrate M after the coating film is removed, whereby the solvent is completely eliminated from substrate M. Therefore, an outer periphery of coating film 100 left on substrate M can be uniform along the edge portion of substrate M.

In this manner, when substrate M is moved forward and its rear end passes arm portion 40, substrate M is now moved backward for a similar treatment. For example, if substrate M is moved back and forth twice, removal of coating film 100 on first two edge portions opposing in the left-right direction is completed. Then, gas operation valve 47*a* of nozzle portion 42 is closed so as to stop feeding of the solvent and also to stop feeding of the nitrogen gas through purge gas feeding pipe 53. Approach stage 33 is moved backward with respect to substrate M by the air cylinder, so as to release the clamped state by approach stages 33, 33. Then, delivery chuck 30 that has been located in the lower portion of coating film removal apparatus 3 is elevated, so as to lift substrate M from chuck 31. In succession, driving portion 30*b* is driven so as to pivot delivery chuck 30 around the vertical axis, so as to turn substrate M by 90°. In this manner, remaining two sides from which coating film 100 has not yet been removed are set so as to be oriented in the direction in which substrate M moves forward. Then, delivery chuck 30 is lowered so as to mount substrate M on chuck 31, followed by removal of coating film 100 on remaining two edge portions of the substrate with the method described previously. Thus, removal of the coating film at all edge portions of substrate M is completed.

Here, when substrate M is moved backward after its forward movement, functions of first nozzle portion 42*a* and second nozzle portion 42*b* are switched therebetween. In other words, second nozzle portion 42*b* now mainly serves to dissolve coating film 100, and first nozzle portion 42*a* mainly serves to blow away the dissolved coating film.

As described above, coating film removal apparatus 3 is fixed and substrate M is moved while it is being clamped and fixed by approach stages 33. When substrate M passes a position in the vicinity of arm portion 40 fixed to the removal apparatus, the solvent is fed to the surface of substrate M from nozzle 42 and the purge gas is fed through purge gas feeding pipe 53, so as to remove coating film 100, the removed coating film being sucked and discharged through discharge pipe 50. Accordingly, a state of discharge pipe 50 or the like provided in arm portion 40 is always maintained constant, and stable discharge as well as stable removal of coating film 100 at the edge portion of the substrate can be achieved. Moreover, large tension is not applied to the pipes such as discharge pipe 40 and feeding pipe 44. As arm portion 40 is fixed, a shorter pipe can be arranged, whereby a diameter of discharge pipe 50 can be made larger. In this manner, the coating film can rapidly be removed.

Approach stages 33 serving as the registration mechanism clamp opposing sides of substrate M, so as to achieve a prescribed orientation of the substrate with high accuracy. Therefore, the direction in which the left and right sides of substrate M extend matches with high accuracy with the direction in which substrate M moves. Accordingly, a removal width of coating film 100 at the edge portion of substrate M is made constant, whereby lowering in yield is suppressed. When substrate M is the mask substrate as in the present embodiment, the removal width of the coating film is considerably small, for example, of the order of 1 mm, and such a small width should be maintained constant with high accuracy. The method according to the present invention is extremely effective for such an application.

Approach stages 33 are located as high as substrate M in both front and rear thereof and on the extension line of its left and right sides. Therefore, when the corner portion of substrate M starts to pass arm portion 40 or completes passage, approach stages 33 are still located in its front and rear. In other words, a state of blowing of the solvent, a state of blowing the purge gas, and a state of discharge are not changed even at the corner portion. Accordingly, a disadvantage such as outward swell of the coating film at the corner portion can be prevented, and stable treatment is achieved.

Figure 14:
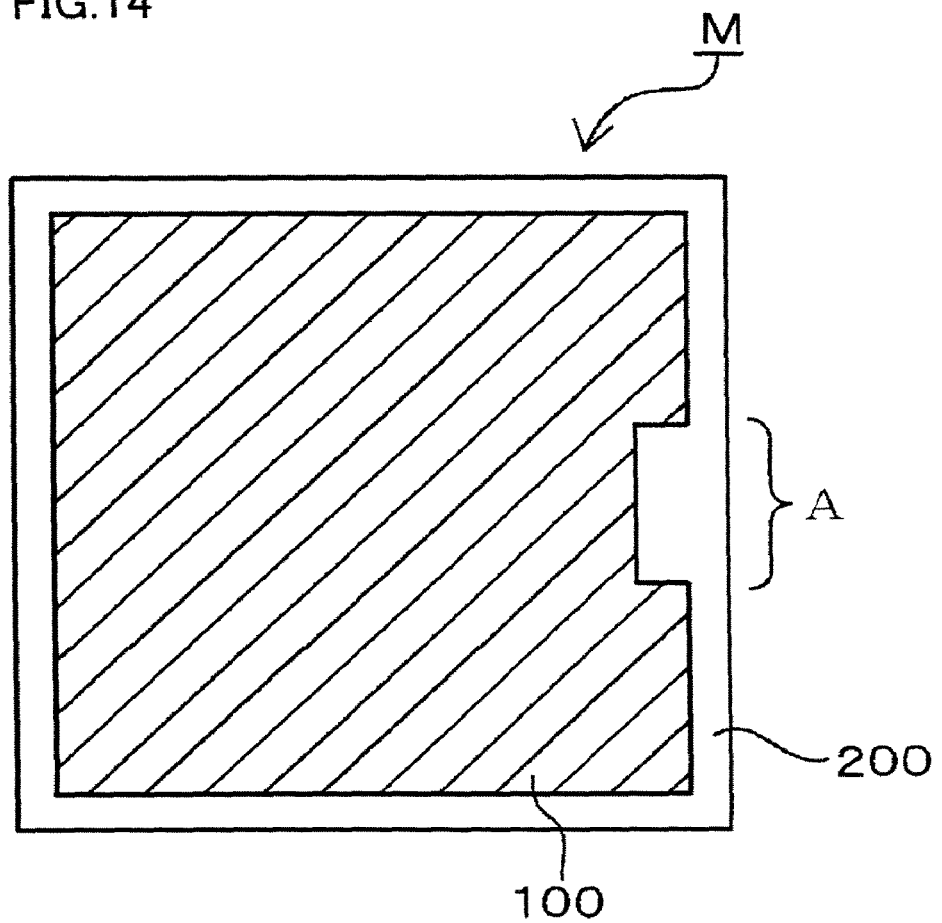
FIG. 14 is a plan view of the substrate when a removal width of the coating film is modified by varying an interval between nozzle portions.

In the embodiment described above, coating film 100 at the edge portion of the substrate is removed by a constant width from the edge portion of the substrate. Meanwhile, a removal width of coating film 100 in a portion A on an edge portion 200 of the substrate may be modified, i.e., made larger as shown in FIG. 14, for example.

Figure 15:
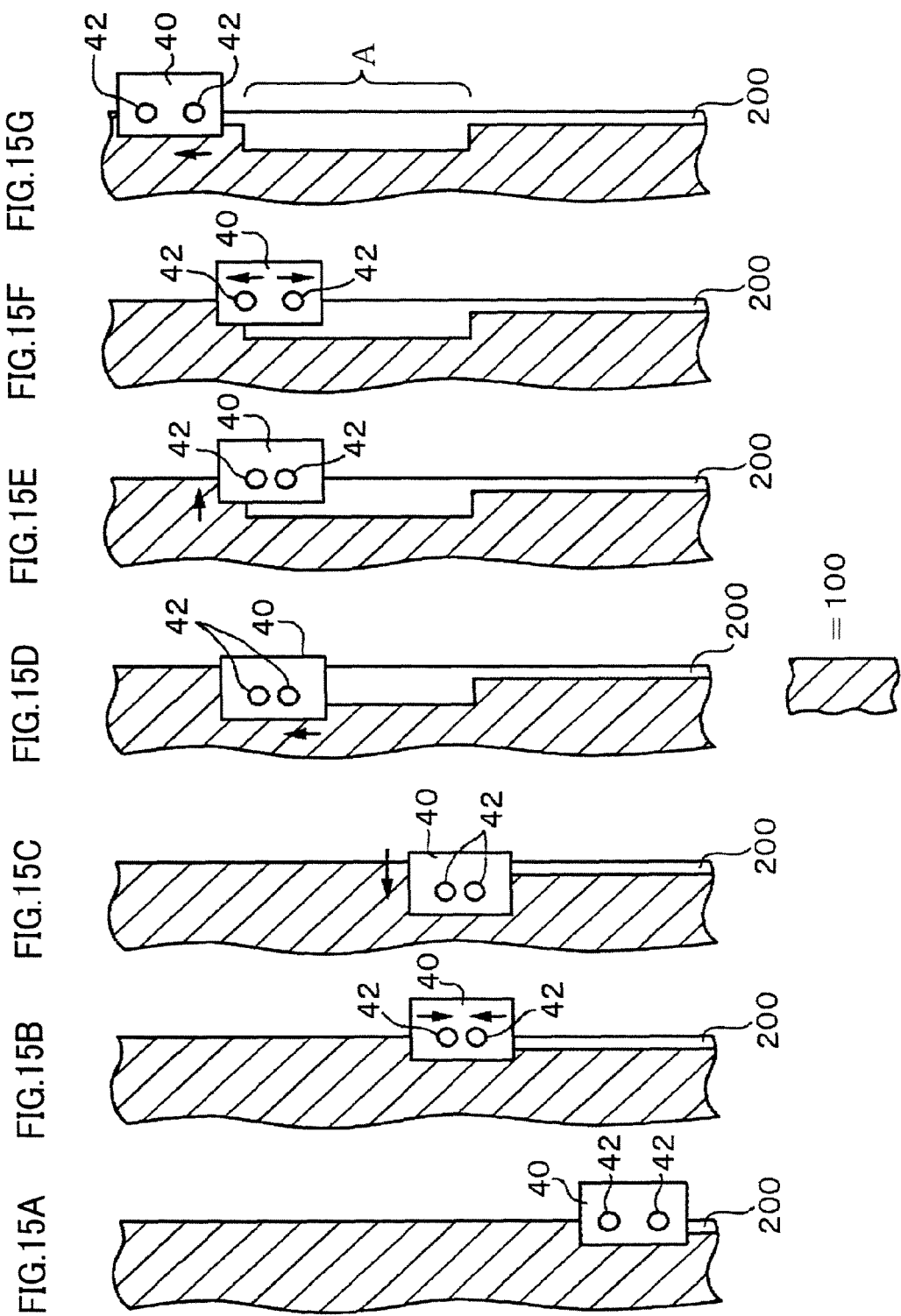
FIGS. 15A to 15G illustrate an operation of the nozzle portions when the removal width of the coating film is modified by varying the interval between the nozzle portions.

A manner how the removal width of coating film 100 in portion A at edge portion 200 of the substrate is modified will be described with reference to FIGS. 15A to 15G. First, FIG. 15A shows a state before the removal width is modified, in which coating film 100 on the surface of substrate M is removed by a constant removal width. FIG. 15B shows a state in which substrate M has moved to a position at which the removal width of coating film 100 is to be modified, that is, made larger. Here, the space between nozzle portions 42 is made narrower. It is assumed here that a length along the side of substrate M in region A is equal to or smaller than half the space between nozzle portions 42*a*, 42*b* until substrate M reaches region A. In this case, a region where neither nozzle portion 42*a* nor 42*b* feeds the solvent is produced, as described in the description of the background art. Therefore, the space between nozzle portions 42*a*, 42*b* is made narrower, so as to be set to not larger than half the length of region A. Then, when forward/backward movement mechanism 49 is operated, arm portion 40 is brought further inside of substrate M (FIG. 15C), and removal of the coating film by a larger removal width is started (FIG. 15D). Then, when substrate M reaches a position at which removal of the coating film by a larger removal width is to be ended, forward/backward movement mechanism 49 is again operated in order to set the removal width of the coating film to the original removal width, whereby arm portion 40 is moved toward outside of substrate M (FIG. 15E). Thereafter, the space between nozzle portions 42 that has been narrowed is again set to the original space (FIG. 15F), and the coating film is removed by the original removal width (FIG. 15G). In this manner, arm portion 40 is allowed to move back and forth with respect to substrate M by means of forward/backward movement mechanism 49, and the space between nozzle portions 42*a*, 42*b* is adjusted. Accordingly, the removal width can be modified as necessary, without restricted to a constant removal width, and the coating film at the edge portion of the substrate can be removed in a manner adapted to a type, a pattern or the like of a manufactured substrate.

Figure 16:
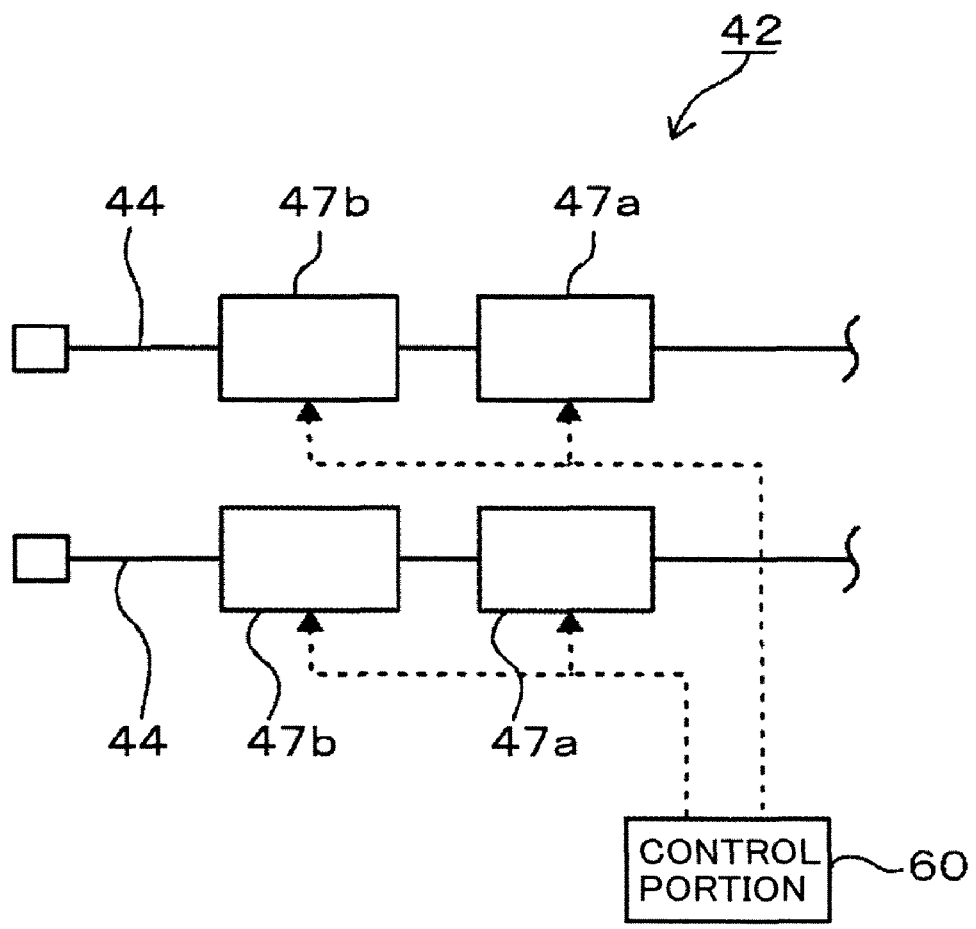
FIG. 16 is a circuit diagram showing a control circuit for a gas operation valve.

Instead of allowing modification of the space between nozzle portions 42*a*, 42*b*, as shown in FIG. 16, a set of gas operation valve 47*a* and suck back valve 47*b* in nozzle portion 42*a* and a set of gas operation valve 47*a* and suck back valve 47*b* in nozzle portion 42*b* may separately be controlled by control portion 60. In such a case, when the coating film is removed by a larger removal width, control is applied such that gas operation valve 47*a* and suck back valve 47*b* in one nozzle portion 42 are closed. Which one of nozzle portions 42*a*, 42*b* is used can be selected as appropriate, depending on a position at which the removal width of the coating film is to be modified. Here, the configuration in FIG. 16 may be combined with the configuration in the previous embodiment in which the space between nozzle portions 42*a*, 42*b* can be adjusted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of removing an unnecessary coating film at an edge portion of a quadrangular substrate on which the coating film is formed, by blowing a solvent to said edge portion, comprising the steps of:

holding said substrate horizontally by a substrate holding portion;

clamping opposite sides of the substrate held by said substrate holding portion by a registration mechanism for achieving registration of the substrate;

moving said substrate holding portion and said registration mechanism in a direction in which other sides except for said opposite sides clamped by said registration mechanism extend; and while moving the substrate, feeding a solvent to the edge portions of said other sides from a solvent nozzle portion of which a distance from the substrate is fixed, and sucking and discharging the solvent and dissolved coating film during said step of moving.

2. The method according to claim 1, wherein said step of clamping for achieving registration of the substrate includes the step of clamping the opposite sides of the substrate by approach stages located as high as a portion of said substrate, one side of said approach stage being positioned proximate to one of the opposite sides of said substrate, and the other side of said approach stage being positioned on an extension line of or outside of one of said other sides of said substrate, and said step of feeding a solvent to the edge portions of said other sides from a solvent nozzle portion includes the step of feeding a solvent continuously from said approach stage to said edge portion of said substrate.

3. The method according to claim 1, wherein said step of feeding a solvent to the edge portions of said other sides from a solvent nozzle portion includes the steps of feeding a solvent from a first solvent nozzle portion and a second solvent nozzle portion provided spaced apart from each other along a direction in which the substrate moves forward while the substrate is being moved, bringing a target position for blowing the solvent from the first solvent nozzle portion and the second solvent nozzle portion toward further inside of the substrate and narrowing the space between the first solvent nozzle portion and the second solvent nozzle portion when the substrate reaches a pre-set position, and feeding the solvent from the first solvent nozzle portion and the second solvent nozzle portion while the substrate is being moved.

4. The method according to claim 3, wherein when the space between the first solvent nozzle portion and the second solvent nozzle portion is adjusted, a space between a first suction and discharge path and a second suction and discharge path provided corresponding to the solvent nozzle portions respectively is adjusted correspondingly.

5. The method according to claim 1, wherein said step of feeding a solvent to the edge portions of said other sides from a solvent nozzle portion includes the steps of feeding a solvent from a first solvent nozzle portion and a second solvent nozzle portion provided spaced apart from each other along a direction in which the substrate moves forward while the substrate is being moved, stopping feeding of the solvent from at least one of the first solvent nozzle portion and the second solvent nozzle portion and bringing a target position for blowing the solvent toward further inside of the substrate, and moving the substrate while the solvent is being fed from said at least one of the solvent nozzle portions.

* * * * *